United States Patent
Baumgartner et al.

(10) Patent No.: US 6,392,215 B1
(45) Date of Patent: May 21, 2002

(54) LASER DIODE DRIVING CIRCUIT

(75) Inventors: Steven John Baumgartner, Zumbro Falls; Daniel Scott Hedin, Rochester; David Warren Siljenberg, Byron, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/399,498

(22) Filed: Sep. 20, 1999

(51) Int. Cl.[7] .................................................. G01J 1/32
(52) U.S. Cl. .................................... 250/205; 372/38.07
(58) Field of Search ............................. 250/205, 214 D; 315/150–159; 372/38.07

(56) References Cited

U.S. PATENT DOCUMENTS

| | | | |
|---|---|---|---|
| 4,856,011 A | | 8/1989 | Shimada et al. ............... 372/38 |
| 5,015,836 A | * | 5/1991 | Van Antwerp ............... 250/205 |
| 5,444,728 A | | 8/1995 | Thompson .................... 372/28 |
| 5,473,623 A | | 12/1995 | Fahey et al. ................... 372/38 |
| 5,802,089 A | | 9/1998 | Link ............................ 372/38 |
| 5,850,409 A | * | 12/1998 | Link ............................ 372/38 |

* cited by examiner

Primary Examiner—Que T. Le
Assistant Examiner—Thanh X. Luu
(74) Attorney, Agent, or Firm—Bracewell & Patterson

(57) ABSTRACT

An improved laser diode driving circuit is disclosed which includes a current source, an operational amplifier, a light sensing device, a current mirror, and a constant current source. The current source is coupled to the laser diode for biasing the laser diode. The operational amplifier has an output coupled to the current source for driving the current source. The operational amplifier includes a first and a second input. The first input is coupled to a reference voltage. The second input receives a feedback signal. The light sensing device is coupled to a first supply voltage for detecting a portion of an optical power output from the laser. The light sensing device generates a monitor current proportional to the detected optical power output. The current mirror is coupled to the light sensing device and the second input of the operational amplifier. The current mirror receives the monitor current and generates a mirror current which is substantially equal to the monitor current. The constant current source is coupled to the second input of the operational amplifier for outputting a reference current. The reference current and the mirror current are then utilized to generate the feedback signal.

14 Claims, 1 Drawing Sheet

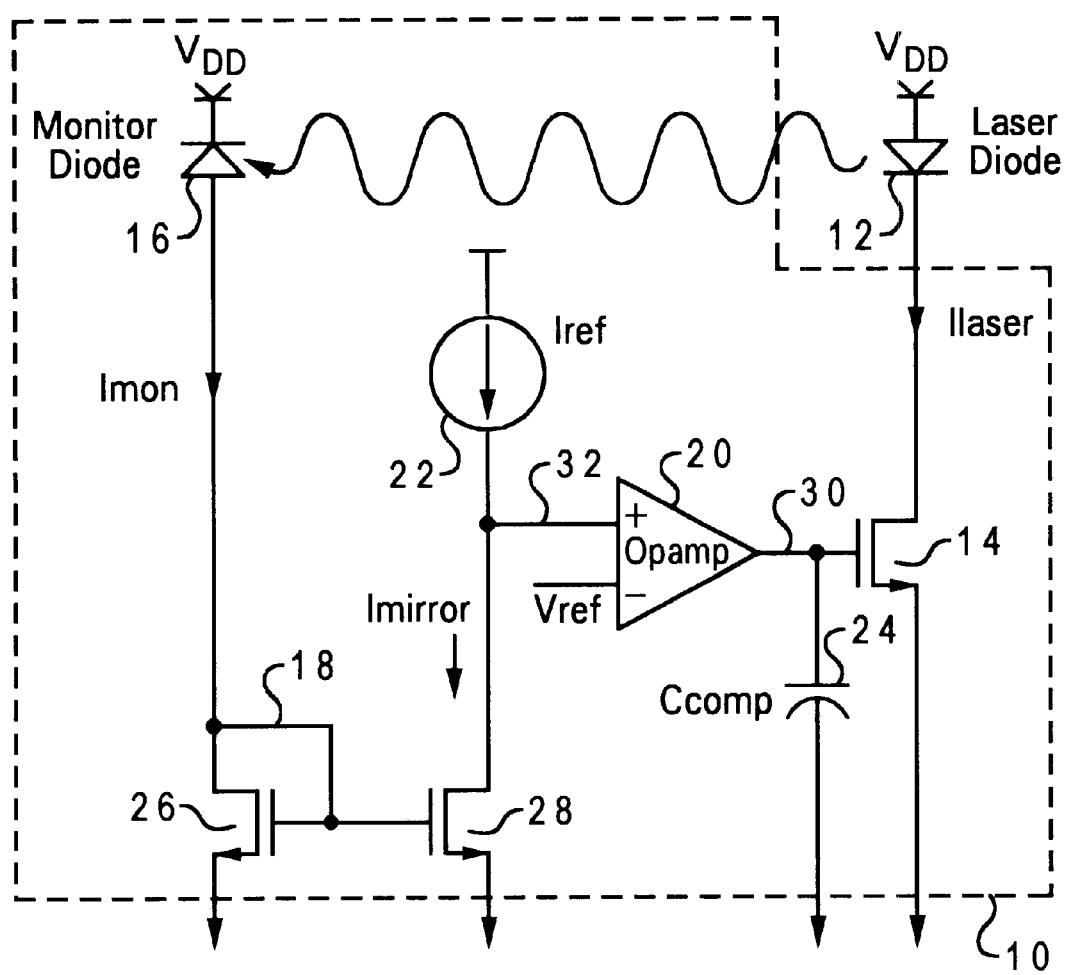

LASER DIODE DRIVING CIRCUIT

BACKGROUND OF THE INVENTION

1. Field of the Invention

The present invention relates in general to semiconductor lasers, and, in particular, to an improved laser diode driving circuit. Still more particularly, the present invention relates to an improved laser diode driving circuit for driving a variety of semiconductor lasers.

2. Description of the Related Art

Reduced scaling or shrinking of the geometries of devices used in integrated semiconductor circuit technology for forming denser circuits has required voltage supply sources to provide lower voltages than the heretofore generally accepted standard supply voltage of 5 volts so as to avoid a voltage breakdown in the smaller devices. These low-power circuits now typically operate in the 3.0 to 3.6 volt supply range.

The forward voltage drop of laser diodes has not decreased in proportion to the decrease in the supply voltage. Therefore, the number of circuits for biasing the laser diodes is limited. Further, it is desirable to develop a biasing circuit capable of being utilized with different types of laser diodes.

One known method for stabilizing the output of a semiconductor laser which fluctuates due to temperature changes includes a counter for controlling the laser power output in a feedback loop. The feedback loop includes a photodetector for detecting the current intensity of the laser beam emitted from a semiconductor laser. Its detected intensity is compared with a predetermined reference level. The count of the counter is updated so as to make the difference between the detected and reference values zero. The updated count is used to vary the level of the driver current to be supplied to the semiconductor laser. A A need exists for an improved laser diode driver circuit capable of being utilized with various laser diodes in a low-power circuit.

SUMMARY OF THE INVENTION

An improved laser diode driving circuit is disclosed which includes a current source, an operational amplifier, a light sensing device, a current mirror, and a constant current source. The current source is coupled to the laser diode for biasing the laser diode. The operational amplifier has an output coupled to the current source for driving the current source. The operational amplifier includes a first and a second input. The first input is coupled to a reference voltage. The second input receives a feedback signal. The light sensing device is coupled to a first supply voltage for detecting a portion of an optical power output from the laser. The light sensing device generates a monitor current proportional to the detected optical power output. The current mirror is coupled to the light sensing device and the second input of the operational amplifier. The current mirror receives the monitor current and generates a mirror current which is substantially equal to the monitor current. The constant current source is coupled to the second input of the operational amplifier for outputting a reference current. The reference current and the mirror current are then utilized to generate the feedback signal.

The above as well as additional objectives, features, and advantages of the present invention will become apparent in the following detailed written description.

BRIEF DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawing, wherein:

The FIGURE illustrates a schematic diagram of an improved laser diode driver circuit in accordance with the present invention.

DETAILED DESCRIPTION OF A PREFERRED EMBODIMENT

The FIGURE illustrates a schematic diagram of an improved laser diode driver circuit in accordance with the present invention. The present invention is a driver circuit 10 for biasing a semiconductor laser 12. Driver circuit 10 is a feedback loop for automatically adjusting a current source 14 coupled to semiconductor laser 12 for biasing laser 12. Driver circuit 10 is designed to drive a variety of different types of semiconductor lasers, and to automatically adjust the bias current supplied to the laser coupled to driver circuit 10 in order to compensate for the differing characteristics of lasers which may be utilized with circuit 10. Driver circuit 10 is designed to provide a constant laser power output in a low-power environment and to compensate for variations in laser 12 due to temperature variation, aging, and/or variations due to different characteristics of different lasers which may be utilized with driver circuit 10.

Driver circuit 10 includes current source 14, a photodetector 16, a current mirror 18, an operational amplifier 20, a constant current source 22, and a compensation capacitor 24. Typically, current source 14, current mirror 18, operational amplifier 20, and compensation capacitor 24 will all be formed as a single integrated circuit. However, those skilled in the art will recognize that these circuit elements could each be a separate component.

Driver circuit 10 includes a feedback loop for automatically adjusting a laser bias current. The feedback loop senses the power output from the laser diode and automatically adjusts the laser bias current accordingly.

The driver circuit drives laser diode using a bias current $I_{LASER}$ provided by bias current source 14. The bias current source 14 is controlled by a bias control signal 30. The bias control signal 30 modifies the bias current, $I_{LASER}$ for the laser 12 so as to provide an automatic power control function.

Photodetector, monitor diode 16, is optically coupled to laser diode 12 in order to receive a portion of the optical power output from laser diode 12. Monitor diode 16 produces a current, $I_{MON}$, which is proportional to the power detected from laser diode 12.

Laser diode 12 is provided with its anode coupled to a first supply voltage, $V_{DD}$, and its cathode coupled to current source 14. Current source 14 is preferably an n-channel field effect transistor with its drain coupled to the cathode of laser diode 12 and its source coupled to a second supply voltage. Typically, the first supply voltage, $V_{DD}$, will be approximately 3.0 to 3.6 volts, and the second supply voltage will be ground, or 0 volts.

The gate of NFET 14 receives bias control signal 30 which is output by operational amplifier 20. In this manner, bias control signal 30 controls and adjusts current source 14 in order to properly bias laser diode 12 utilizing current $I_{LASER}$.

Monitor diode 16 has its cathode coupled to the first voltage source $V_{DD}$ and its anode coupled to transistor 26 included in current mirror 18. Monitor diode 16 receives a portion of the optical power output from laser diode 12. In response to the received power, monitor diode 16 generates a current, $I_{MON}$, which is proportional to the optical power it received from laser diode 12. The current, $I_{MON}$, is received by current mirror 18. In response to receipt of the current $I_{MON}$, current mirror 18 generates a mirrored version of this current as $I_{MIRROR}$. The current, $I_{MIRROR}$, is substantially equal to $I_{MON}$.

Current mirror 18 includes two transistors, NFET 26 and 28. The gates of NFET 26 and 28 are coupled together. The drain of NFET 26 is coupled to the anode of monitor diode 16 and to the gate of NFET 26. The drain of NFET 28 is coupled to node 32. The sources of NFET 26 and 28 are both coupled to the second supply voltage.

Operational amplifier 20 receives as its input a voltage reference signal, $V_{REF}$, on its inverting input. The non-inverting input of operational amplifier 20 is coupled to node 32. Preferably, $V_{REF}$ will be a voltage approximately halfway between the first and second supply voltages.

Constant current source 22 and current mirror 18 are coupled to the non-inverting input of operational amplifier 20. Current source 22 generates a constant current $I_{REF}$. The mirrored current, $I_{MIRROR}$, is compared to $I_{REF}$. When $I_{MIRROR}$ equals $I_{REF}$, the non-inverting input of operational amplifier 20 will equal the inverting input $V_{REF}$ causing the feedback loop to stabilize.

Instead of directly comparing $I_{REF}$ with $I_{MON}$, a mirrored version ($I_{MIRROR}$) is utilized. Monitor diode 16 is coupled to current mirror 18 which has a lower impedance. Thus, the monitor diode node is a non-dominant pole in the feedback loop.

The monitor diode naturally has high capacitance but is not the ideal place for loop frequency compensation for power supply noise rejection reasons. The compensation must be done at the output of the operational amplifier for maximum AC power supply rejection ratio (PSRR). The operational amplifier is designed to have a high impedance output, unlike an ideal operational amplifier, to help AC PSRR and to make that node the dominant pole in the loop.

The output of the operational amplifier drives a large NFET 14. NFET 14 must be large in order to support the large dynamic range (2–40 mA). This large NFET 14 has high transconductance. Any noise at the output of the operational amplifier is therefore amplified. This noise is filtered out by putting a large capacitor 24 on this node. This then serves as the dominant pole for frequency compensation.

While a preferred embodiment has been particularly shown and described, it will be understood by those skilled in the art that various changes in form and detail may be made therein without departing from the spirit and scope of the present invention.

What is claimed is:

1. A circuit for driving a laser diode, comprising:
   a current source coupled to said laser for biasing said laser;
   an operational amplifier having a high impedance output coupled to said current source for driving said current source, said operational amplifier having a first and a second input, said first input being coupled to a reference voltage, said second input for receiving a feedback signal;
   a light sensing device coupled to a first supply voltage for detecting an optical power output from said laser, said light sensing device generating a monitor current proportional to said detected optical power output;
   a current mirror coupled to said light sensing device and said second input of said operational amplifier, said current mirror for receiving said monitor current and for generating a mirror current, said mirror current being substantially equal to said monitor current;
   a constant current source coupled to said second input for outputting a reference current, said reference current and said mirror current being utilized to generate said feedback signal; and
   a capacitor coupled between said output of said operational amplifier and a ground potential that filters said output and functions as a dominant pole for frequency compensation.

2. The circuit according to claim 1, wherein said light sensing device is a photodiode.

3. The circuit according to claim 2, wherein said current source coupled to said laser is a field effect transistor.

4. The circuit according to claim 1, wherein said reference voltage is a voltage equal to half of said first supply voltage.

5. The circuit according to claim 1, wherein said current mirror, said operational amplifier, said capacitor, and said current source are all formed together as a single integrated circuit.

6. The circuit according to claim 1, wherein said current mirror comprises a pair of field effect transistors.

7. A method for driving a laser diode, said method comprising the steps of:
   said laser diode outputting an optical power level in response to a laser current received from a current source;
   receiving said optical power level and generating a monitor current utilizing a light sensing device;
   receiving said monitor current and generating a mirror current utilizing a current mirror;
   inputting a feedback signal equal to a difference between said mirror current and a reference current into a first input of an operational amplifier having a high impedance output;
   comparing said feedback signal to a reference value input into a second input of said operational amplifier;
   generating a control signal utilizing said operational amplifier in response to said feedback signal being different from said reference value;
   filtering said control signal utilizing a capacitor coupled between said high impedance output of said operational amplifier and a ground potential; and
   outputting an adjusted laser current utilizing said current source in response to a receipt of said control signal.

8. The method circuit according to claim 7, wherein said step of receiving said optical power level and generating a monitor current utilizing a light sensing device further comprising the step of receiving said optical power level and generating a monitor current utilizing a photodiode.

9. The method according to claim 8, wherein said step of said laser diode outputting an optical power level in response to a laser current received from a current source further comprises the step of said laser diode outputting an optical power level in response to a laser current received from a field effect transistor.

10. A circuit for driving a laser diode, comprising:
    a current source coupled to said laser for biasing said laser;
    an operational amplifier having a high impedance output coupled to said current source for driving said current source in response to a comparison of a feedback signal with a reference voltage, said operational amplifier having a first and a second input, said first input being coupled to said reference voltage, said second input for receiving said feedback signal;

a photodiode coupled to a first supply voltage for detecting an optical power output from said laser, said photodiode generating a monitor current proportional to said detected optical power output;

a current mirror coupled to said photodiode and said second input of said operational amplifier, said current mirror for receiving said monitor current and for generating a mirrorcurrent, said mirror current being substantially equal to said monitor current;

a constant current source coupled to said second input for outputting a reference current, said reference current and said mirror current being utilized to generate said feedback signal, said feedback signal being equal to said reference voltage in response to said mirror current and said reference current being equal; and a capacitor coupled between said output of said operational amplifier and a ground potential that filters said output and functions as a dominant pole for frequency compensation.

11. The circuit according to claim 10, wherein said current source coupled to said laser is a field effect transistor.

12. The circuit according to claim 10, wherein said reference voltage is a voltage equal to half of said first supply voltage.

13. The circuit according to claim 10, wherein said current mirror, said operational amplifier, said capacitor, and said current source are all formed together as a single integrated circuit.

14. The circuit according to claim 10, wherein said current mirror comprises a pair of field effect transistors.

* * * * *